United States Patent
Kohn et al.

(10) Patent No.: US 10,201,113 B2
(45) Date of Patent: Feb. 5, 2019

(54) AIR-COOLED ELECTRONIC EQUIPMENT AND DEVICE FOR COOLING AN ELECTRONIC COMPONENT

(71) Applicant: SAGEMCOM BROADBAND SAS, Rueil-Malmaison (FR)

(72) Inventors: Stephane Kohn, Rueil-Malmaison (FR); Herve Lieven, Rueil-Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 14/425,286

(22) PCT Filed: Sep. 6, 2013

(86) PCT No.: PCT/EP2013/068514
§ 371 (c)(1),
(2) Date: Mar. 2, 2015

(87) PCT Pub. No.: WO2014/037530
PCT Pub. Date: Mar. 13, 2014

(65) Prior Publication Data
US 2015/0264835 A1    Sep. 17, 2015

(30) Foreign Application Priority Data
Sep. 6, 2012 (FR) ...................... 12 58361

(51) Int. Cl.
*H01L 23/467* (2006.01)
*H05K 1/02* (2006.01)
(Continued)

(52) U.S. Cl.
CPC .......... *H05K 7/20172* (2013.01); *F28D 1/02* (2013.01); *H01L 23/467* (2013.01);
(Continued)

(58) Field of Classification Search
CPC ............... H01L 23/467; H01L 23/4006; H01L 23/4093; H01L 23/367; G06F 1/203;
(Continued)

(56) References Cited

U.S. PATENT DOCUMENTS 4,442,450 A * 4/1984 Lipschutz ............. H01L 23/433
165/80.2
4,770,242 A * 9/1988 Daikoku ............. H01L 23/4338
165/185
(Continued)

*Primary Examiner* — Adam B Dravininkas
(74) *Attorney, Agent, or Firm* — Muncy, Geissler, Olds & Lowe, P.C.

(57) ABSTRACT

The invention concerns a piece of electronic equipment comprising a card (2) provided with an electronic component (3), a radiator (5) having a bottom (6) topped by fins (7), the bottom of the radiator resting on the electronic component, and a cover (8) extending above the radiator providing an air flow around the fins of the radiator, the cover comprising a plurality of flexible blades (11), each applied to an upper edge of at least one of the fins to keep the radiator applied against the component, and the flexible blades (11) have a first end integral with the cover and a second free end applied against the upper edge of the fins. A cooling device with a radiator and a cover for holding the radiator in place.

16 Claims, 2 Drawing Sheets

(51) Int. Cl.
*H05K 7/20* (2006.01)
*F28D 1/02* (2006.01)

(52) U.S. Cl.
CPC ....... *H05K 7/2049* (2013.01); *H05K 7/20154* (2013.01); *H05K 7/20436* (2013.01); *F28D 2001/0286* (2013.01)

(58) Field of Classification Search
CPC ...... G06F 1/20; G06F 2200/201; G06F 1/183; H05K 7/20727; H05K 7/20772; H05K 7/20809; H05K 1/0203; H05K 7/20172; H05K 7/20154; H05K 7/20445; H05K 7/2049; H05K 5/0221; H05K 7/20436
USPC ....... 361/679.47, 679.54, 697, 702, 709–711
See application file for complete search history.

(56) References Cited

U.S. PATENT DOCUMENTS

| | | | | |
|---|---|---|---|---|
| 5,201,866 A | * | 4/1993 | Mok | F28F 3/02 165/185 |
| 5,896,269 A | * | 4/1999 | Autry | H01L 23/3672 165/185 |
| 7,262,964 B1 | | 8/2007 | Barsun | |
| 8,353,746 B2 | * | 1/2013 | Tsai | G06F 1/185 454/284 |
| 2001/0017764 A1 | * | 8/2001 | Nakamura | G06F 1/203 361/697 |
| 2002/0018335 A1 | * | 2/2002 | Koizumi | G06F 1/1632 361/679.47 |
| 2002/0036889 A1 | * | 3/2002 | Ruiz-Gomez | H05K 7/2049 361/695 |
| 2003/0072135 A1 | * | 4/2003 | Lonergan | H01R 12/721 361/709 |
| 2006/0060328 A1 | * | 3/2006 | Ewes | H01L 23/427 165/80.2 |
| 2006/0278380 A1 | * | 12/2006 | Kang | H01L 23/367 165/148 |
| 2008/0123263 A1 | * | 5/2008 | Ueda | G06F 1/203 361/688 |
| 2008/0163631 A1 | * | 7/2008 | Campbell | H05K 7/20809 62/175 |
| 2012/0140403 A1 | * | 6/2012 | Lau | H01L 23/427 361/679.47 |

\* cited by examiner

AIR-COOLED ELECTRONIC EQUIPMENT AND DEVICE FOR COOLING AN ELECTRONIC COMPONENT

The present invention relates to air-cooled electronic equipment, and to a cooler device for cooling an electronic component.

Such electronic equipment comprises a card having electronic components fastened thereto. Those electronic components that give off the most heat are cooled by a radiator having fins projecting from a bottom that rests on the electronic component(s), and the equipment includes forced ventilation means such as a fan and an air guide for channeling the air coming from the fan so that it reaches the radiator. This serves to transfer heat by conduction between the electronic component and the radiator and to transfer heat by convection between the radiator and the air that is used for carrying away the heat produced while the components are in operation.

The radiator is fastened by thermal adhesive or by mechanical assembly using a pin that passes over the radiator and that is clip-fastened to the card in order to press the bottom of the radiator against the electronic component. Adhesive is not always possible because of problems of compatibility between the adhesive and the material from which the electronic component is made. This incompatibility can lead to the radiator separating from the electronic component. Clip-fastening the pin can give rise to mounting errors that may compromise retention of the electronic component and thus compromise cooling of the electronic component and proper operation of the electronic equipment as a whole.

The lack of reliability of the fastening thus runs the risk of poor quality of contact between the electronic component and the radiator, thereby limiting the transfer of heat to the radiator and leading to poor operation of the electronic equipment.

An object of the invention is thus to provide means for improving the reliability with which the radiator is fastened on the electronic component.

To this end, the invention provides electronic equipment comprising a card having an electronic component, a radiator having a bottom carrying fins, the bottom of the radiator resting on the electronic component, and the equipment also having a cover extending over the radiator and arranging for air to flow around the fins of the radiator. The cover includes a plurality of spring blades, each pressed against a top edge of at least one of the fins in order to hold the radiator pressed against the component, and the spring blades have respective first ends that are secured to the cover and respective second ends that are free and pressed against the top edge of at least one fin.

Thus, the radiator is held mechanically in place on the electronic component by the cover without any need to also provide a fin. This serves to limit any risk of poor mounting.

The spring blades are pressed independently against the radiator at at least two points, thus making it possible:
- to provide relative stability for the radiator;
- to tend to return the radiator at least in part towards a horizontal position, should it be poorly positioned; and
- to have the second ends either at the same height or else at different heights when the radiator has fins of different heights. By acting on their stiffnesses, the spring blades can also be arranged to exert stresses on the radiator that are identical or that are different.

Preferably, the cover forms a guide for air and possesses an end in which a fan is fastened.

The invention also provides a cooler device for an electronic component, the device comprising a radiator having a bottom carrying fins, the bottom of the radiator being arranged to rest on the electronic component, and the device also having a cover arranged to extend over the radiator so as to provide a flow of air around the fins of the radiator. The cover includes at least one spring blade arranged to be pressed against a top edge of at least one of the fins so as to hold the radiator pressed against the component, and each spring blade has a first end that is secured to the cover and a second end that is free and pressed against the top edge of at least one fin.

Other characteristics and advantages of the invention appear on reading the following description of particular, non-limiting embodiments of the invention.

Reference is made to the accompanying drawing, in which.

Figure 1:
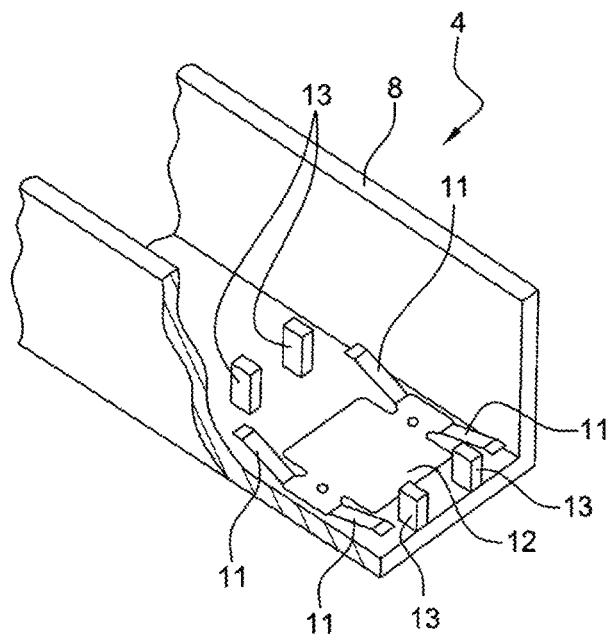
FIG. 1 is a fragmentary cutaway perspective view of a cover of equipment in accordance with the invention.
Figure 2:
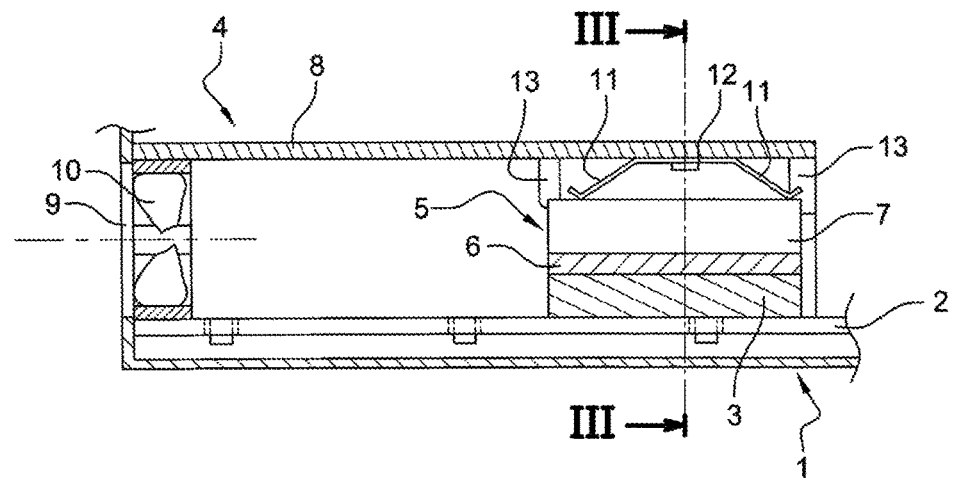
FIG. 2 is a fragmentary diagrammatic view in section of the equipment of the invention.
Figure 3:
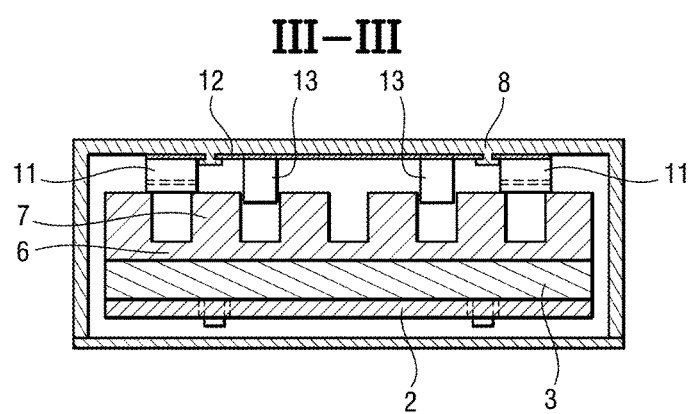
FIG. 3 is a view in longitudinal section III of the equipment of the invention, shown in FIG. 2.

With reference to the figures, the electronic equipment of the invention comprises an outer housing, given overall reference 1, and receiving both a card 2 carrying an electronic component 3, and also a cooler device given overall reference 4.

The cooler device 4 has a radiator given overall reference 5 comprising a bottom 6 carrying fins 7. The bottom 6 of the radiator 5 rests on the top surface of the electronic component 3. A heat transfer layer, which may optionally be adhesive, and which may optionally make use of phase change, may be arranged between the component and the bottom of the radiator in order to provide a better transfer of heat between the component and the radiator.

The cooler device 4 has a cover 8 extending over the radiator 5 while allowing air to flow around the fins 7 of the radiator 5.

The cover 8 is shaped as a guide for air that extends from a ventilation opening 9 of the housing 1 to the radiator 5, and a fan 10 is mounted in the cover 8 in the vicinity of the ventilation opening 9. The cover is of channel-section with its free edges being provided with barbs that are resiliently engaged in openings in the card 2. The cover 8 is thus fastened directly onto the card 2, and the fan 10 is fastened in the end of the cover 8 that lies in the vicinity of the ventilation opening 9.

The cover 8 has spring blades 11 pressed against a top edge of at least one of the fins 7 in order to keep the radiator 5 pressed against the electronic component 3. Each spring blade 11 has a midplane parallel to the planes of the fins 7, and in this example a width that is greater than the spacing between the fins 7, so that each spring blade 11 bears on at least one fin 7, and preferably on two adjacent fins 7. Each spring blade 11 has an end secured to a support part 12 fitted in the cover and an end that is free and that is pressed against the top edge of one or more fins 7. The support part 12 is fastened to the web of the cover 8 by thermoplastic deformation (flattening) of studs that project from the web and that are engaged in orifices in the support part 12. At rest (i.e. before the cover is put into place over the radiator), the spring blades 11 extend at an angle relative to the support part 12, which angle lies in the range 20° to 45° in this example. In the rest position, the spring blades 11 leave space inside the cover 8 occupying a height that is less than the height of the assembly comprising the electronic component 3 together with the radiator 5. In this example there are four spring blades 11 having their free ends arranged at the vertices of a parallelogram. When the cover 8 is in place and the spring blades 11 are pressed against the radiator 5, the spring blades 11 are deformed elastically so that the angle in question is reduced and the spring blades 11 tend to return to their initial positions, thereby exerting a force on the radiator 5, which tends to press against the electronic component 3. The free ends of the spring blades 11 are curved upwards so as to reduce friction between the spring blades 11 and the fins 7 of the radiator 5 while the cover 8 is being put into place.

The cover 8 is also provided internally with positioning portions in relief 18 arranged to be engaged between two fins 7 of the radiator 5. The positioning portions in relief 13 project from the web of the cover 8 and they serve to ensure that the radiator 5 is positioned laterally in the event of the spring blades 11 failing.

When the spring blades are made of thermally conductive material, heat is transferred between the radiator and the spring blades. In particular when the ambient temperature is high (e.g. 40° C.), the spring blades then behave like an additional radiator enhancing the cooling of the component.

Naturally, the invention is not limited to the embodiments described, but covers any variant coming within the ambit of the invention as defined by the claims.

In particular, the spring blades may be of a structure that is different from that described. Each spring blade may thus be curved in shape, with both ends fastened to the cover like a leaf spring so as to bear against the radiator via a curved central portion.

The spring blades may be individual blades or they may form parts of a common support part. The blades may be fastened by staking, adhesive, soldering, overmolding, . . . .

The spring blades may be of a width that is smaller than the spacing between the fins, but the relative positioning between the radiator and the blades must be accurate in order to be certain that each blade bears against a fin and does not lie between two fins.

There may be two or more spring blades, e.g. three or six. The spring blades may have stiffnesses that are different (by being of lengths, shapes, and/or materials that are different).

The invention is applicable to any type of electronic equipment.

The invention applies to means for cooling, regardless of whether the cooling is natural or forced.

The cover may be constituted by a portion of the housing of the equipment that does not itself perform a cooling function.

The cover may be fastened to a surrounding frame that serves as a support for the electronic card. The cover thus forms the housing of the equipment and may be arranged so that it also forms a guide for air.

In this example the four positioning portions in relief 13 lie substantially outside the spring blades 11 in the longitudinal direction of the cover 8. In a variant, the positioning portions in relief 13 could be positioned between the spring blades 11. The number of them could also be changed.

The invention claimed is:

1. Electronic equipment comprising a card having an electronic component, a radiator having a bottom carrying fins, the bottom of the radiator having a face opposed to the fins resting on the electronic component, and the equipment also having a cover extending over the radiator and arranging for air to flow around the fins of the radiator, the cover including a plurality of spring blades, each pressed against a top edge of at least one of the fins in order to hold the radiator pressed against the component, and the spring blades have respective first ends that are secured to the cover and respective second ends that are free and pressed against the top edge of at least one fin, the number of spring blades being smaller than the number of fins.

2. Equipment according to claim 1, comprising an outer housing including a ventilation opening, the cover extending from the ventilation opening to the radiator, a fan being mounted in the cover in the vicinity of the ventilation opening, a part of the cover forming a guide air under which the spring blades extend and to which the spring blades are secured.

3. Equipment according to claim 2, wherein the cover is fastened directly to the card.

4. Equipment according to claim 1, wherein the spring blade is of width that is greater than spacing between the fins.

5. Equipment according to claim 1, wherein the first end of each spring blade is secured to a support part fitted in the cover.

6. Equipment according to claim 1, wherein the cover is provided with at least one positioning portion in relief arranged to be engaged between two fins of the radiator.

7. Equipment according to claim 1, wherein the second ends of the spring blades are at least four in number, being arranged at the vertices of a parallelogram.

8. A cooler device for an electronic component, the device comprising a radiator having a bottom carrying fins, the bottom of the radiator having a face opposed to the fins and being arranged to rest on the electronic component, and the device also having a cover arranged to extend over the radiator so as to provide a flow of air around the fins of the radiator, the cover including spring blades, each arranged to press against a top edge of at least one of the fins so as to hold the radiator pressed against the component, each spring blade having a first end that is secured to the cover and a second end that is free and pressed against the top edge of at least one fin of the radiator, the number of spring blades being smaller than the number of fins.

9. A device according to claim 8, wherein the cover possesses an end in which a fan is fastened, a part of the cover forming a guide air under which the spring blades extend and to which the spring blades are secured.

10. A device according to claim 8, wherein the spring blade is of width that is greater than spacing between the fins.

11. A device according to claim 8, wherein the first ends of the spring blades are secured to a support part fitted in the cover.

12. A device according to claim 8, wherein the cover is provided with at least one positioning portion in relief arranged to be engaged between two fins of the radiator.

13. A cooler device according to claim 8, wherein, at rest (i.e. before being pressed against the radiator), the spring blades extend at an angle lying in the range 20° to 45° relative to the support part.

14. A device according to claim 8, wherein the free ends of the blades are curved towards the cover.

15. Electronic equipment comprising a card having an electronic component, a radiator having a bottom carrying fins, the bottom of the radiator having a face opposed to the fins resting on the electronic component, and the equipment also having a cover extending over the radiator and arranging for air to flow around the fins of the radiator, the cover including a plurality of spring blades, each pressed against a top edge of at least one of the fins in order to hold the radiator pressed against the component, and the spring blades have respective first ends that are secured to the cover and respective second ends that are free and pressed against the top edge of at least one fin, the number of spring blades being smaller than the number of fins, the equipment comprising an outer housing including a ventilation opening, the cover extending from the ventilation opening to the radiator, a fan being mounted in the cover in the vicinity of the ventilation opening, a part of the cover forming a guide air under which the spring blades extend and to which the spring blades are secured.

16. Electronic equipment comprising a card having an electronic component, a radiator having a bottom carrying fins, the bottom of the radiator having a face opposed to the fins resting on the electronic component, and the equipment also having a cover extending over the radiator and arranging for air to flow around the fins of the radiator, the cover including a plurality of spring blades, each pressed against a top edge of at least one of the fins in order to hold the radiator pressed against the component, and the spring blades have respective first ends that are secured to the cover and respective second ends that are free and pressed against the top edge of at least one fin, the number of spring blades being smaller than the number of fins the equipment comprising an outer housing including a ventilation opening, the cover extending from the ventilation opening to the radiator, a fan being mounted in the cover in the vicinity of the ventilation opening, a part of the cover forming a guide air under which the spring blades extend and to which the spring blades are secured, wherein the cover is fastened directly to the card.

\* \* \* \* \*